United States Patent [19]

Runaldue et al.

[11] Patent Number: 5,191,244
[45] Date of Patent: Mar. 2, 1993

[54] N-CHANNEL PULL-UP TRANSISTOR WITH REDUCED BODY EFFECT

[75] Inventors: Thomas J. Runaldue; Qazi R. M. Mahmood, both of San Jose, Calif.

[73] Assignee: Advanced Micro Devices, Inc., Sunnyvale, Calif.

[21] Appl. No.: 760,313

[22] Filed: Sep. 16, 1991

[51] Int. Cl.$^5$ ........................................ H03K 19/0175
[52] U.S. Cl. .................................. 307/475; 307/443; 307/296.2
[58] Field of Search .................... 307/296.2, 443, 448, 307/475, 572, 577, 579

[56] References Cited

U.S. PATENT DOCUMENTS

| 3,720,848 | 3/1973 | Schmidt, Jr. | 307/579 |
| 4,324,991 | 4/1982 | Tamaki | 307/579 |
| 4,473,761 | 9/1984 | Peterson | 307/579 |

FOREIGN PATENT DOCUMENTS

| 0013029 | 1/1983 | Japan | 307/577 |
| 0082019 | 4/1988 | Japan | 307/448 |

Primary Examiner—Edward P. Westin
Assistant Examiner—Benjamin D. Driscoll
Attorney, Agent, or Firm—Davis Chin

[57] ABSTRACT

A CMOS output buffer circuit employing an N-channel pull-up transistor with reduced body effect includes an N-channel pull-up transistor (N2), an N-channel coupling transistor (N1), and an N-channel discharging transistor (N3). The pull-up transistor has its drain connected to an upper power supply potential (VCC), its source connected to an output node (20), its gate connected to a first internal node (B), and its local substrate connected to a second internal node (A). The coupling transistor has its source connected to the second internal node (A), its drain connected to the source of the pull-up transistor, its gate connected to the first internal node (B), and its local substrate connected to the local substrate of the pull-up transitor (N2). The discharging transistor has its drain connected to the second internal node (A), its source connected to a lower power supply potential (VCC), its gate connected to a third internal node (C), and its local substrate connected to the lower power supply potential (VSS). The coupling transistor and the discharging transistor serve to reduce the body effect on the pull-up transistor (N2) and to provide higher immunity from noise on the upper power supply potential (VCC).

5 Claims, 2 Drawing Sheets

N-CHANNEL PULL-UP TRANSISTOR WITH REDUCED BODY EFFECT

BACKGROUND OF THE INVENTION

This invention relates generally to CMOS output buffer circuits and more particularly, it relates to a CMOS output buffer circuit employing an N-channel pull-up transistor with reduced body effect.

As is well-known in the art, digital logic circuits are widely used in the areas of electronics and computer-type equipment. Specifically, one such use of digital logic circuits is to provide an interface function between one logic type of a first integrated circuit device and another logic type of a second integrated logic device. An output buffer circuit is an important component for this interface function so as to render the two different logic types to be compatible. The output buffer circuit provides, when enabled, an output signal which is a function of a data input signal received from other logic circuitry of the integrated circuit.

Output buffer circuits typically use a pull-up transistor device connected between an upper power supply potential and an output node, and a pull-down transistor device connected between a lower power supply potential and the output node. Dependent upon the logic state of the data input signal and an enable signal, either the pull-up or pull-down transistor device is quickly turned on and the other one of them is turned off. When the enable signal is not asserted, the output node will be at a high impedance state referred to sometimes as the tri-state mode.

Sometimes, a P-channel device is provided so as to function as the pull-up device for generating a high output voltage level $V_{OH}$ corresponding to the high logic level. However, in applications which require the high drive capability the P-channel pull-up devices have been replaced with N-channel devices because their intrinsic mobility is more than twice than that of the P-channel device. With its greater mobility, the N-channel device is twice as conductive as compared to the P-channel device of an equal size. Due to its greater conduction, the N-channel device will have only half of the impedance between the drain terminal and the source terminal than an equivalent P-channel device. When such N-channel devices are utilized as the pull-up devices, they operate like source followers. In other words, the source electrode of the N-channel devices will attempt to follow the voltage at its gate electrode. The only disadvantage in using the N-channel devices is that the source electrode can only be pulled up to a voltage which is a threshold drop below the gate voltage.

Nevertheless, in the typical output buffer circuits the requirement is usually to pull the output node to a TTL (transistor-transistor-logic) level of only approximately +2.4 volts. With the upper power supply potential of +5.0 volts connected to its drain and its gate driven to +5.0 volts, the N-channel pull-up transistor can not achieve this TTL level if the effective threshold $V_{Tn}$ of such N-channel transistor is greater than +1.0 volts. Since the effective threshold $V_{Tn}$ is dependent upon the potential applied between the source and the substrate of the transistor referred sometimes to as the "body effect," transistors having a high "gamma" may fail to pull the output node to the desired TTL level due to saturation. One of the ways in which to overcome this problem is to tie the local substrate (P-well) of the N-channel transistor to its source region, thereby rendering the body effect to be zero. Further, a P-channel transistor is sometimes also connected in parallel with the N-channel pull-up transistor for facilitating the pull-up operation of the output node. In fact, such P-channel pull-up transistors can indeed pull the output node all the way up to the supply potential VCC if sufficient time is allowed for the operation.

However, the N-channel pull-up transistor having its source tied to its substrate and operated in the manner described above could possibly encounter certain problems. These problems can primarily be seen when the output buffer circuits are operated in the tri-state mode. In VLSI technology, there may be provided many output buffer circuits each having its output node tied together to a common I/O bus line with only one of the buffer circuits being active at one time. Under these circumstances, the single active output buffer circuit driving such common bus line will see a heavy loading effect caused by the additional parasitic capacitances of the collective P-wells of all of the remaining output buffer circuits which are in the tri-state mode.

Another problem encountered by such output buffer circuits is the power supply noise being coupled to the common bus line through one or more of the buffer circuits operated in the tri-state mode. If the output node of the active buffer circuit is required to be held close to the power supply level of VCC corresponding to the high logic state, the noise induced on the internal power supply node may degrade the output voltage level causing interface problems among the output buffer circuits and other integrated circuits. This noise also may cause the internal power supply node to undershoot the VCC level, which will cause the P-N diode between the P-well tied to the common bus line and the drain of the N-channel pull-up transistor to be forward biased and thus directly coupling the noise on the internal power supply node to the common bus line.

It would therefore be desirable to provide a CMOS output buffer circuit employing an N-channel pull-up transistor with reduced body effect. This is achieved in the present invention by a coupling transistor and a discharging transistor so as to control coupling and decoupling of the P-well of the N-channel pull-up transistor.

SUMMARY OF THE INVENTION

Accordingly, it is a general object of the present invention to provide a CMOS output buffer circuit employing an N-channel pull-up transistor with reduced body effect which is relatively simple and economical to manufacture and assemble, but yet overcomes the disadvantages of the prior art output buffer circuits.

It is an object of the present invention to provide a CMOS output buffer circuit employing an N-channel pull-up transistor which has a reduced body effect and a higher immunity from noise on the power supply potential.

It is another object of the present invention to provide a CMOS output buffer circuit which includes a pull-up N-channel transistor, a coupling transistor, and a pull-down transistor.

In accordance with these aims and objectives, the present invention is concerned with the provision of a CMOS output buffer circuit employing an N-channel pull-up transistor with reduced body effect. The output buffer circuit includes an N-channel pull-up transistor, an N-channel coupling transistor, and an N-channel discharging transistor. The pull-up transistor has its drain connected to an upper power supply potential, its source connected to an output node, its gate connected to a first internal node, and its substrate connected to a second internal node. The coupling transistor has its source connected to the second internal node, its drain connected to the source of the pull-up transistor, its gate connected to the first internal node, and its substrate connected to the substrate of the pull-up transistor. The discharging transistor has its drain connected to the second internal node, its source connected to the lower power supply potential, its gate connected to a third internal node, and its substrate connected to the lower power supply potential. The coupling transistor and the discharging transistor serve to reduce the body effect on the pull-up transistor and to provide a higher immunity from noise on the upper power supply potential.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
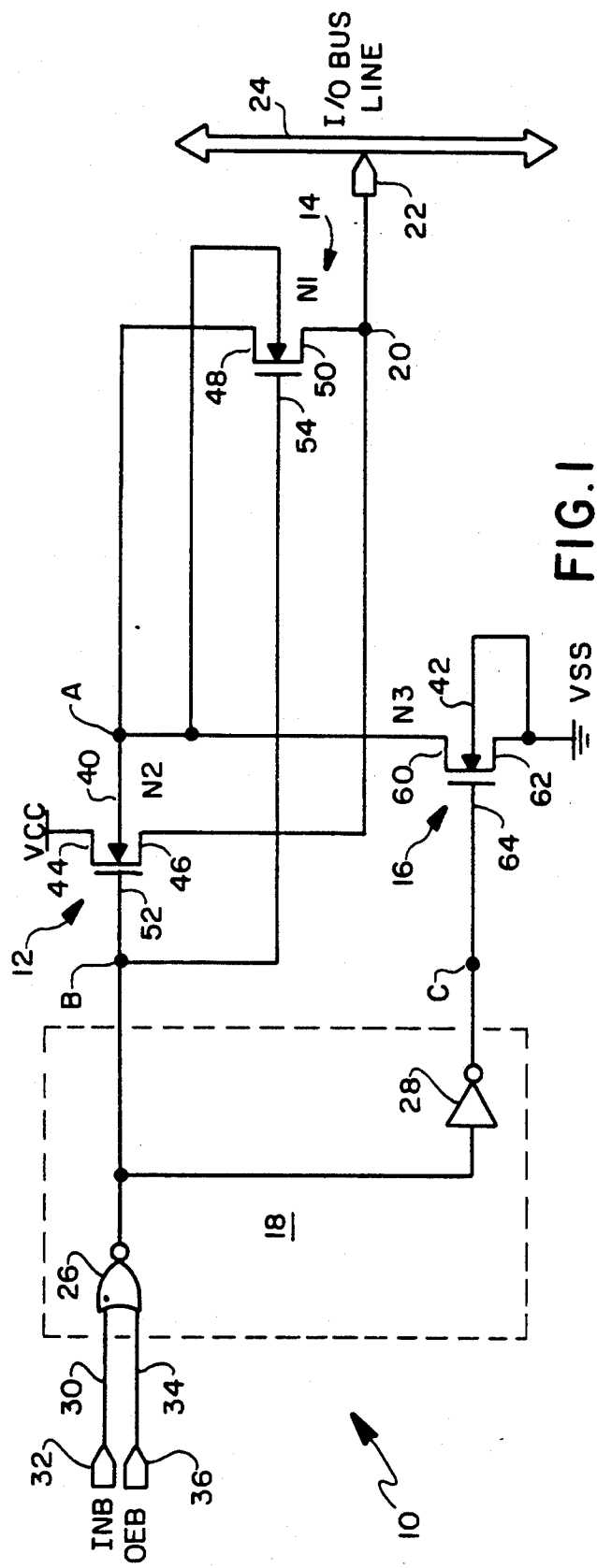
FIG. 1 is a schematic diagram of a CMOS output buffer circuit employing an N-channel pull-up transistor with reduced body effect, constructed in accordance with the principles of the present invention.

Referring now in detail to the drawings, there is shown a schematic diagram of a part of a CMOS output buffer circuit 10 formed on a monolithic semiconductor integrated circuit chip which is constructed in accordance with the principles of the present invention. The output buffer circuit 10 includes a pull-up transistor device 12, a coupling transistor device 14, a pull-down or discharging transistor device 16 and control circuitry 18. The present output buffer circuit 10 provides a reduced body effect on the pull-up transistor device 12 as well as producing an improved VCC noise immunity.

The pull-up transistor device 12 is formed of a relatively large size N-channel MOS transistor N2 which has a high drive capability. The transistor N2 has its drain connected to an upper power supply potential VCC, which is typically at +5.0 volts, and its source connected to an output node 20. The output node 20 is connected to an external terminal pin 22, which is coupled to a common I/O bus line 24. It should be noted that a pull-down device (not shown) is typically connected between the output node 20 and a lower power supply potential VSS. However, the pull-down device has been purposely omitted for the sake of clarity since it does not form a part of the present invention. A number of other output buffer circuits (also not shown) similar to the buffer circuit 10 will each have its output nodes coupled to the common bus line 24. The gate of the pull-up transistor N2 is connected to an internal node B, and the local substrate of the pull-up transistor N2 is connected to an internal node A.

The coupling transistor device 14 is formed of a relatively small size N-channel MOS transistor N1. The transistor N1 has its source connected to the internal node A, its gate connected to the internal node B, and its drain connected to the source of the pull-up transistor N2 at the output node 20. The local substrate of the coupling transistor N1 is tied to the local substrate of the pull-up transistor N2 at the internal node A. It should be apparent to those skilled in the art that the N-channel transistor N1 may be replaced with a P-channel transistor.

The pull-down or discharging transistor device 16 is formed of a relatively small size N-channel MOS transistor N3 which is similar to the size of the coupling transistor N1. The transistor N3 has its drain connected to the common substrate (P-well No. 1 in FIG. 2) of the transistors N1 and N2 at the internal node A and its gate connected to an internal node C. The source of the pull-down transistor N3 is connected to its substrate, which is tied the lower power supply potential or ground VSS.

The control circuitry 18 includes a NOR logic gate 26 and an inverter 28. The NOR logic gate has a first input on line 30 which is connected to an input terminal 32 for receiving an input control signal INB. The NOR logic gate has a second input on line 34 which is connected to an input terminal 36 for receiving an enable signal OEB. The output of the logic gate 26 is connected to the internal node B and to the input of the inverter 28. The output of the inverter 28 is connected to the internal node C.

When the enable signal OEB is at a low (VSS) or logic "0" level and the input control signal INB is at a high (VCC) or logic "1" level, the output of the NOR gate 26 will be at the low logic level. As a result, the pull-up transistor N2 will be turned off. On the other hand, when the enable signal OEB is at the low (VSS) or logic "0" level and the input control signal INB is at the low (VSS) or logic "0" level, the output of the NOR gate 26 will be at the high logic level. As a consequence, the pull-up transistor N2 and the coupling transistor N1 will both be turned on. Due to the inverter 28, the node C will be at the low logic level, which will turn off the discharging transistor N3. Thus, the output node 20 will be pulled towards the upper power supply potential VCC.

When the enable signal OEB is at the high (VCC) or logic "1" level, the output of the NOR gate 26 will be at the low logic level. This causes the pull-up transistor N2 to be turned off. This produces the high impedance tri-state mode at the output node 20 in which the output buffer circuit 10 is disabled.

Figure 2:
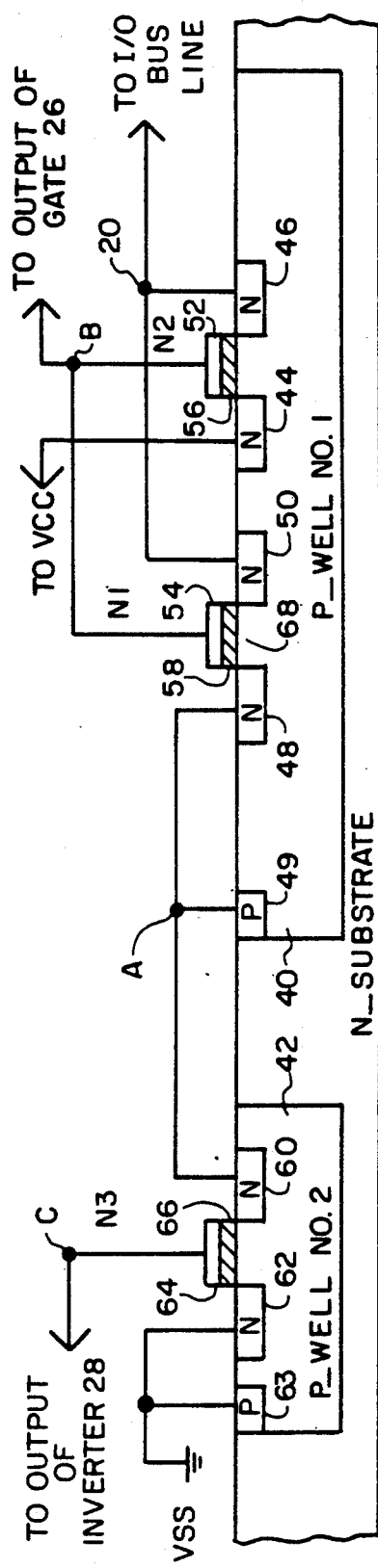
FIG. 2 is a cross-sectional representation of the physical structure of a portion of the circuit of FIG. 1.

With reference now directed to FIG. 2, a specific structure implementing a part of the output buffer circuit of FIG. 1 is illustrated. For convenience, identical reference numerals are employed in FIG. 2 to designate structural elements corresponding to symbols in the electrical schematic diagram of FIG. 1. It will be appreciated by those skilled in the art that FIG. 2 is a cross-sectional view only and has omitted a number of conventional features required in a practical device.

The structure of FIG. 2 is formed on a common substrate 38 which is a body of semiconductor of an N-conductivity type material in which are diffused P-regions 40 and 42, denoted as P-well No. 1 and No. 2, respectively. N-regions 44 and 46 diffused in the P-region 40 form the drain and source regions of the pull-up transistor N2. N-regions 48 and 50 are diffused in the same P-well No. 1 (P-region 40) as the transistor N2 so as to form the source and drain regions of the coupling transistor N1. This serves to eliminate any body effect on the pull-up transistor N2. The size of the coupling transistor N1 is selected so as to obtain an effective rate of charging of the P-well No. 1 (P-region 40), but yet maintaining the necessary noise margin of the I/O bus line 24 from the supply potential VCC.

The N-region 46 defined as the source of the transistor N2 is connected to the N-region 50 defined as the drain of the transistor N1 and to the output node 20. The N-region 44 defined as the drain of the transistor N2 is connected to the supply potential VCC. The gate electrodes 52 and 54 of the respective transistors N2 and N1 are spaced from the P-region 40 (which is the local substrate of the transistors N2 and N1) by insulating layers 56 and 58. The insulating layers 56 and 58 may comprise any suitable insulating material, such as silicon dioxide. The gate electrodes 52 and 54 themselves may comprise any suitable conductive material, such as aluminum or highly-doped polycrystalline silicon. The gate electrodes 52 and 54 are connected together and to the internal node B. The N-region 48 defined as the source of the transistor N1 is connected to its local substrate (region 40) via a heavily-doped P+ well-contact region 49 and to the internal node A.

N-region 60 and 62 diffused in the P-region 42 form the drain and source regions of the discharging transistor N3. The N-region 60 defined as the drain of the transistor N3 is also connected to the substrate 40 via the contact region 49. The gate electrode 64 of the discharging transistor N3 is spaced from the local substrate 42 by an insulating layer 66. The gate electrode 64 is connected to the internal node C. The N-region 62 defined as the source of the transistor N3 is connected to its substrate 42 (P-well No. 2) via a heavily-doped P+ well-contact region 63 and to the ground potential VSS. The size of the discharging transistor N3 is determined by the desired rate of the P-well No. 2 discharging.

It should now be apparent by tying the P-region 40 (P-well No. 1) via the contact region 49 and the internal node A to the output node 20 through the conduction channel of the coupling transistor N1, instead of directly to the output node 20, there is produced the necessary reduced body effect with much improved performance. The conduction channel being designated generally by reference numeral 68 only exists when induced by a suitable voltage applied to the gate electrode 54. This technique serves to isolate the parasitic load of the P-wells from the I/O bus line 24 which has a number of other tri-state output buffer circuits connected thereto when the bus line is being driven by one of the output buffer circuits.

Therefore, by controlling the bias level of the P-well of the active output buffer circuit there is obtained a better noise margin on the I/O bus line 24 which is pulled high by a noisy VCC power supply. Further, the high potential on the I/O bus line is lowered in the P-well by provision of some attenuation through the coupling transistor N1 when transistors N2 and N1 are both turned on, thereby providing better isolation of the I/O bus line from the under-shooting of the supply potential VCC.

It will be further noted that the P-wells of all of the output buffer circuits in the tri-state mode on the common bus line are de-coupled therefrom and are discharged to ground, thereby preventing the injection of noise from the power supply VCC to the I/O bus line. As will be understood, if these P-wells were left floating they could charge up to a level which may possibly forward bias the P-N diodes between the P-well and N-diffusion regions of the transistors in the well. These P-wells are discharged to ground by the discharging transistor N3. The grounded P-wells also facilitate better cutoff of the coupling transistor N1, especially since this transistor N1 must have no leakage current requirement during the tri-state mode of the output buffer circuit. Consequently, the active output buffer circuit does not see the additional parasitic capacitances of the P-wells of the tri-stated buffers so as to improve its performance.

Figure 3:
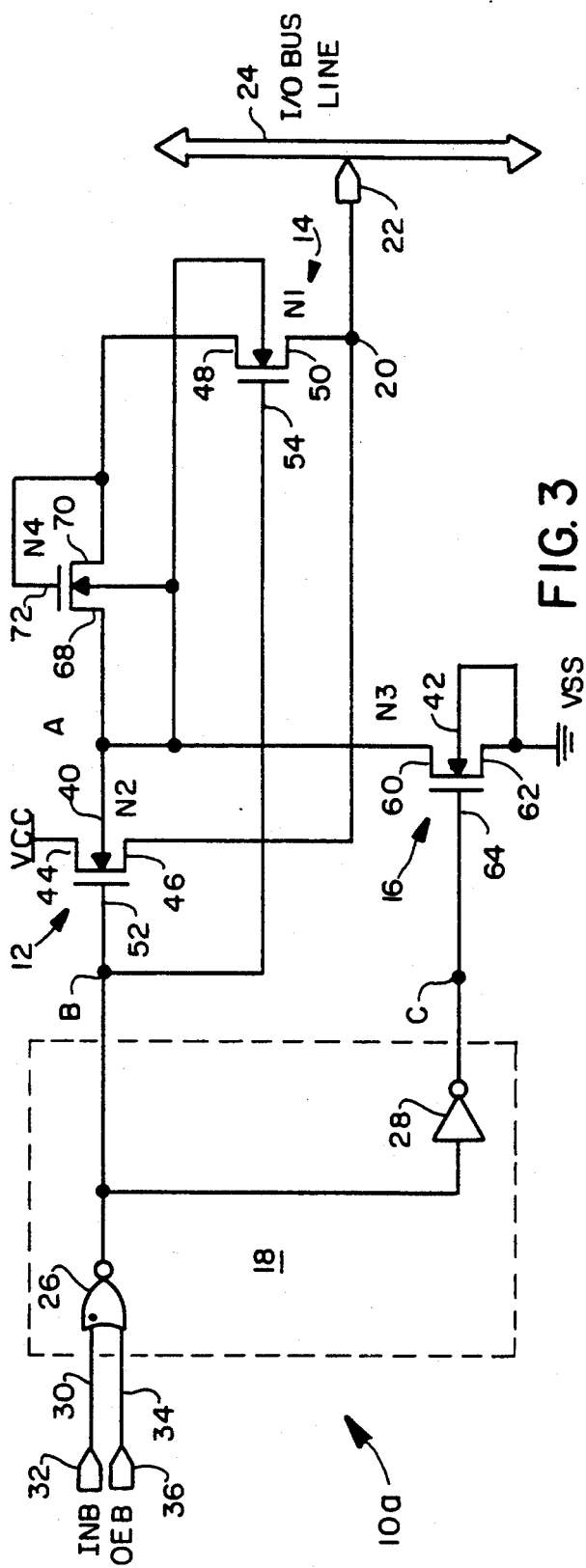
FIG. 3 is a schematic diagram of a second embodiment of the CMOS output buffer circuit in accordance with the present invention.

With reference now to FIG. 3, there is shown a second embodiment of an output buffer circuit 10a in accordance with the invention. The circuit 10a of FIG. 3 differing from the circuit 10 of FIG. 1 in that an N-channel saturated transistor N4 is connected between the coupling transistor N1 and the P-well No. 1 (P-region 40). More particularly, the transistor N4 has its gate and drain source electrodes connected together and to the source of the coupling transistor N1. The source of the saturated transistor N4 is connected to its substrate and to the internal node A.

It will be appreciated that the circuit 10a of FIG. 3 operates substantially identical to the circuit of FIG. 1, and thus a detailed description thereof accordingly will not be repeated. However, it should be noted that a lower P-well potential is obtained so as to provide a greater voltage difference between the supply potential VCC and the P-well. This lower P-well potential serves to produce a higher noise margin by preventing the P-well from coupling to the N-region 44 (drain region) of the pull-up transistor N2 which is tied to the supply potential VCC. The saturated transistor N4 enables the I/O bus line 24 to withstand larger VCC noise undershoots when the pull-up transistor N2 is turned on.

Figure 4:
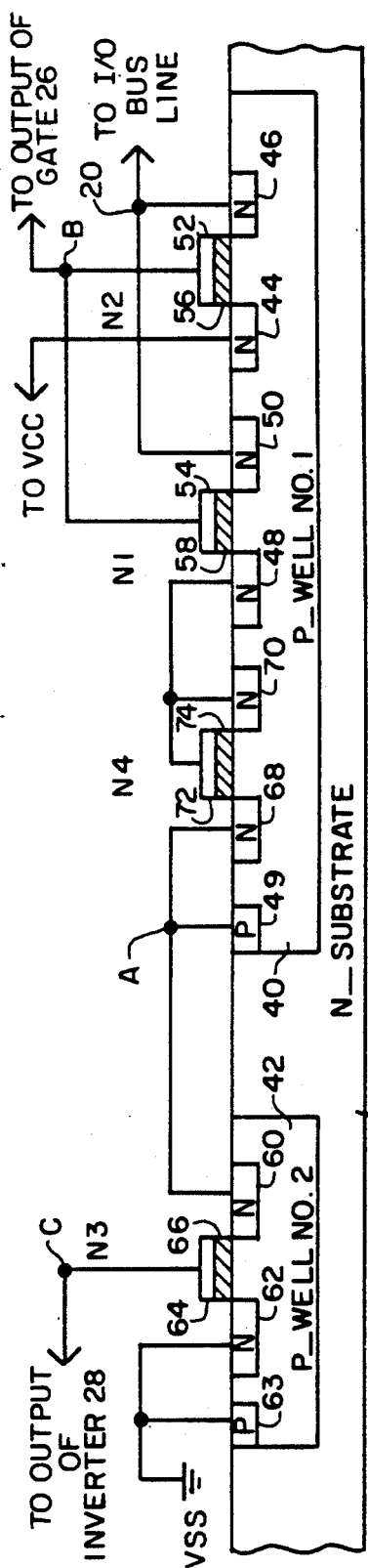
FIG. 4 is a cross-sectional representation of the physical structure of a portion of the circuit of FIG. 3.

Referring to FIG. 4, a specific structure implementing the circuit of FIG. 3 is shown. Again, for convenience, identical reference numerals are employed in FIG. 4 to designate the structural elements corresponding to symbols in the electrical schematic diagram of FIG. 3. In order to provide the additional N-channel saturated transistor N4, N-regions 68 and 70 are diffused in the same P-well No. 1 (P-region 40) as the transistors N2 and N1 so as to form the source and drain regions of the transistor N4. The gate electrode 72 of the saturated transistor N4 is spaced from the P-well 40 by an insulating layer 74. The N-region 68 defined as the source of the transistor N4 is connected to its local substrate (region 40) via the well-contact region 49 and to the internal node A. N-region 70 defined as a drain of the transistor N4 is connected to its gate electrode 72 and to the source region 48 of the coupling transistor N1.

From the foregoing detailed description, it can thus be seen that the present invention provides a CMOS output buffer circuit employing an N-channel pull-up transistor with reduced body effect. The output buffer circuit of the present invention includes an N-channel pull-up transistor, an N-channel coupling transistor, and an N-channel pull-down transistor. The coupling transistor and the pull-down transistor serve to reduce the body effect on the pull-up transistor and provides higher improved VCC noise immunity.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A CMOS output buffer circuit employing an N-channel pull-up transistor with reduced body effect, comprising:
    an N-channel pull-up transistor (N2) having its drain connected to an upper power supply potential (VCC), its source connected to an output node (20), its gate connected to a first internal node (B), and its local substrate connected to a second internal node (A);
    an N-channel coupling transistor (N1) having its source connected to the second internal node (A), its drain connected to the source of said pull-up transistor (N2), its gate connected to the first internal node (B), and its local substrate connected to the local substrate of said pull-up transistor (N2); and
    an N-channel discharging transistor (N3) having its drain connected to the second internal node (A), its source connected to a lower power supply potential (VSS), its gate connected to a third internal node (C), and its local substrate connected to the lower power supply potential (VSS),
    whereby said coupling transistor and said discharging transistor serves to reduce the body effect on said pull-up transistor and to provide higher immunity from noise on the upper power supply potential (VCC).

2. A CMOS output buffer circuit as claimed in claim 1, further comprising an N-channel saturated transistor (N4) coupled between said second internal node (A) and said coupling transistor (N1).

3. A CMOS output buffer circuit as claimed in claim 2, wherein said saturated transistor (N4) has its source connected to said second internal node (A), its gate connected to its drain and to the source of said coupling transistor (N1), and its local substrate connected to said second internal node (A).

4. In an integrated circuit device formed on a semiconductor substrate of an N-conductivity type, an output buffer comprising:
    a first well-region (40) of a P-conductivity type embedded in said semiconductor substrate (38);
    first and second N-conductivity type spaced apart regions (44, 46) embedded within said first well-region (40) for forming the drain and source of a pull-up transistor;
    first gate electrode (52) being formed over the region between the drain and source of the pull-up transistor;
    third and fourth N-conductivity type spaced apart regions (48, 50) also embedded within said first well-region (40) for forming the source and drain of a coupling transistor;
    a second gate electrode (54) being formed over the region between the drain and source of the coupling transistor;
    a second well-region (42) of a P-conductivity type also embedded within said semiconductor substrate (38);
    fifth and sixth N-conductivity type spaced apart regions (60, 62) embedded within said second well-region (42) forming the drain and source of a discharging transistor;
    a third gate electrode (64) being formed over the region between the drain and source of the discharging transistor;
    means for connecting said first region (44) to an upper power supply potential (VCC);
    means for connecting said first and second gate electrodes (52, 54) to a first node (B);
    means for connecting said second and fourth regions (46, 50) to an output node (20);
    means for connecting said third and fifth regions (48, 60) to said first well-region (40) and to a second node (A);
    means for connecting said third gate electrode (64) to a third node (C); and
    means for connecting said sixth region (62) to said second well-region (42) and to a lower power supply potential (VSS).

5. In an integrated circuit device as claimed in claim 4, further comprising seventh and eighth N-conductivity type spaced apart regions (68, 70) also embedded within said first well-region (40) for forming the source and drain of a saturated transistor, a fourth gate electrode (72) being formed over the region between the drain and source of the saturated transistor, means for connecting said seventh region (68) to said first well-region (40) and to said second node (A), and means for connecting said eighth region (70) to said fourth gate electrode (72) and to said third region (48).

* * * * *

UNITED STATES PATENT AND TRADEMARK OFFICE
CERTIFICATE OF CORRECTION

PATENT NO. : 5,191,244

DATED : March 2, 1993

INVENTOR(S) : Thomas J. Runaldue et al.

It is certified that error appears in the above-indentified patent and that said Letters Patent is hereby corrected as shown below:

On the Title page, item [75], Inventors, the initials "R.M." should be deleted.

Signed and Sealed this

Twenty-fifth Day of January, 1994

Attest:

BRUCE LEHMAN

*Attesting Officer*  *Commissioner of Patents and Trademarks*